(12) United States Patent
Chung et al.

(10) Patent No.: US 8,637,765 B2
(45) Date of Patent: Jan. 28, 2014

(54) SINGLE JUNCTION TYPE CIGS THIN FILM SOLAR CELL AND METHOD FOR MANUFACTURING THE THIN FILM SOLAR CELL

(75) Inventors: Yong-Duck Chung, Daejeon (KR); Won Seok Han, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 91 days.

(21) Appl. No.: 13/207,825

(22) Filed: Aug. 11, 2011

(65) Prior Publication Data

US 2012/0103418 A1    May 3, 2012

(30) Foreign Application Priority Data

Nov. 3, 2010  (KR) .................... 10-2010-0108880

(51) Int. Cl.
| | |
|---|---|
| H01L 21/00 | (2006.01) |
| H01L 23/00 | (2006.01) |
| H01L 25/00 | (2006.01) |
| H01L 27/00 | (2006.01) |
| H01L 27/14 | (2006.01) |

(52) U.S. Cl.
USPC ........... 136/262; 136/264; 136/265; 257/431; 257/E31.119; 438/72; 438/95

(58) Field of Classification Search
USPC ........ 438/FOR. 427; 136/251, 246, 256, 259, 136/265, 243
See application file for complete search history.

(56) References Cited

U.S. PATENT DOCUMENTS 3,558,527 A * 1/1971 Maruyama ................... 252/500
7,235,736 B1 * 6/2007 Buller et al. ................. 136/251

* cited by examiner

*Primary Examiner* — Ha Tran T Nguyen
*Assistant Examiner* — Thai T Vuong
(74) *Attorney, Agent, or Firm* — Rabin & Berdo, P.C.

(57) ABSTRACT

Provided is a single junction type CIGS thin film solar cell, which includes a CIGS light absorption layer manufactured using a single junction. The single junction type CIGS thin film solar cell includes a substrate, a back contact deposited on the substrate, a light absorption layer deposited on the back contact and including a P type CIGS layer and an N type CIGS layer coupled to the P type CIGS layer using a single junction, and a reflection prevention film deposited on the light absorption layer.

9 Claims, 1 Drawing Sheet

SINGLE JUNCTION TYPE CIGS THIN FILM SOLAR CELL AND METHOD FOR MANUFACTURING THE THIN FILM SOLAR CELL

CROSS-REFERENCE TO RELATED APPLICATIONS

The present application claims priority to Korean patent application number 10-2010-0108880, filed on Nov. 3, 2010, which is incorporated by reference in its entirety.

BACKGROUND OF THE INVENTION

The present invention relates to a single junction type CIGS (Cu (In, Ga) $Se_2$) thin film solar cell and a method for manufacturing the single junction type CIGS thin film solar cell, and more particularly, to a single junction type CIGS thin film solar cell including a CIGS light absorption layer manufactured using a single junction, and a method for manufacturing the single junction type CIGS thin film solar cell.

In recent years, interest in solar cells is increasing because of energy and environmental issues.

Solar cells, which absorb sunlight to convert it to electricity, are classified into solar heat cells that use solar heat to generate steam for rotating a turbine, and photovoltaic cells that use the nature of a semiconductor to convert the energy of sunlight into electrical energy.

In general, solar cells are referred to as photovoltaic cells (hereinafter, solar cells).

The above description relates to the related art for clarifying the present invention, and the related art is distinct from the prior art.

SUMMARY OF THE INVENTION

Embodiments of the present invention are directed to a single junction type CIGS thin film solar cell including a single junction CIGS light absorption layer having a P type CIGS semiconductor layer and an N type CIGS semiconductor layer, and a method for manufacturing the single junction type CIGS thin film solar cell.

Embodiments of the present invention are also directed to a single junction type CIGS thin film solar cell that includes a light absorption layer having a P type CIGS layer and an N type CIGS layer coupled to the P type CIGS layer to form a single junction, and a method for manufacturing the single junction type CIGS thin film solar cell, which make it possible to prevent surface and interface contamination due to a buffer layer and environmental pollutions due to a toxic element, and to improve the performance of the solar cell.

In one embodiment, a single junction type CIGS (Cu (In, Ga) $Se_2$) thin film solar cell includes: a substrate; a back contact disposed on the substrate; a light absorption layer disposed on the back contact and comprising a single junction diode comprising a CIGS thin film; and a reflection prevention film disposed on the light absorption layer.

The light absorption layer may include: a P type CIGS layer disposed on the back contact; and an N type CIGS layer disposed on the P type CIGS layer using a single junction.

The single junction type CIGS thin film solar cell may further include a window layer disposed on the N type CIGS layer between the light absorption layer and the reflection prevention film.

In another embodiment, a method for manufacturing a single junction type CIGS (Cu (In, Ga) $Se_2$) thin film solar cell includes: preparing a substrate; depositing a back contact of molybdenum (Mo) on the substrate by using a sputtering method; depositing an P type CIGS layer on the back contact by using a co-evaporation method; depositing an N type CIGS layer on the P type CIGS layer; and depositing a reflection prevention film of $MgF_2$ on the N type CIGS layer by using an electron-beam evaporation method.

The depositing of the N type CIGS layer may include mixing an alkali metal with a selenide, and using a co-evaporation method.

The alkali metal may include natrium (Na).

The selenide may include $Na_2Se$.

DESCRIPTION OF SPECIFIC EMBODIMENTS

Figure 1:
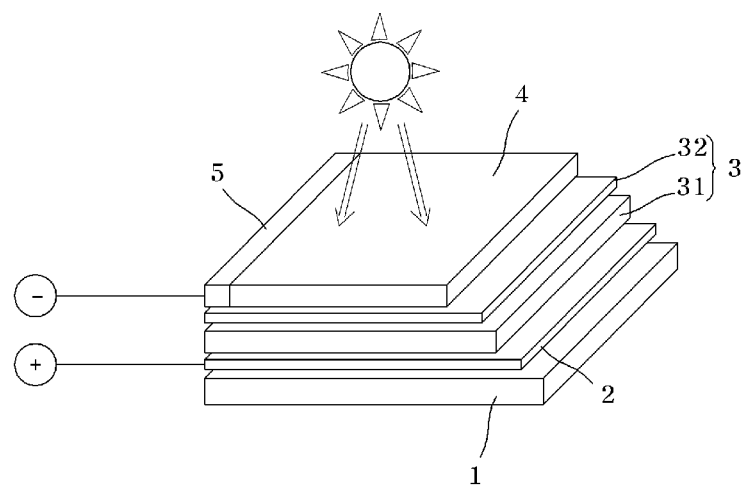
FIG. 1 illustrates a schematic view of a single junction type CIGS thin film solar cell according to an embodiment of the present invention.

Hereinafter, a single junction type CIGS (Cu (In, Ga) $Se_2$) thin film solar cell and a method for manufacturing the single junction type CIGS thin film solar cell in accordance with the present invention will be described in detail with reference to the accompanying drawings.

Hereinafter, the present invention will be described in more detail through embodiments. The embodiments are merely for exemplifying the present invention, and the right protection scope of the present invention is not limited by the embodiments.

In the drawings, the thicknesses of lines or the sizes of elements may be exaggeratedly illustrated for clarity and convenience of description. Moreover, the terms used henceforth have been defined in consideration of the functions of the present invention, and may be altered according to the intent of a user or operator, or conventional practice. Therefore, the terms should be defined on the basis of the entire content of this specification.

Figure 2:
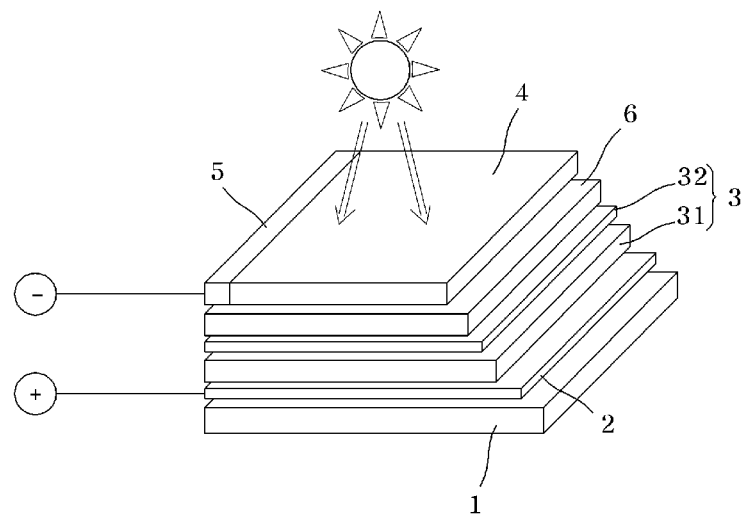
FIG. 2 illustrates a schematic view of a single junction type CIGS thin film solar cell according to another embodiment of the present invention.

FIG. 1 illustrates a schematic view of a single junction type CIGS thin film solar cell according to an embodiment of the present invention. FIG. 2 illustrates a schematic view of a single junction type CIGS thin film solar cell according to another embodiment of the present invention.

Referring to FIG. 1, a single junction type CIGS thin film solar cell according to an embodiment of the present invention includes a substrate 1, a back contact 2 deposited on the substrate 1, a light absorption layer 3, and a reflection prevention film 4 deposited on the light absorption layer 3. The light absorption layer 3 includes a P type CIGS layer 31 and an N type CIGS layer 32, which are coupled to each other to form a single junction and are deposited on the back contact 2.

The substrate 1 is formed of sodalime glass. Alternatively, the substrate 1 may be a ceramic substrate including alumina or quartz; a metal substrate including stainless steel, Cu tape, Cr steel, Kovar (Ni/Fe alloys), Ti, ferritic steel, or Mo; or a polymer including Kapton, Upilex, or ETH-PI.

The back contact 2 is formed of Mo. This is because Mo has high electrical conductivity, can be in ohmic contact with CIGS, and has high temperature stability in Se atmosphere.

A Mo thin film is formed using a direct current (DC) sputtering method. The Mo thin film has low resistivity as an electrode, and great adhering force to the substrate 1 to prevent peeling due to a difference in thermal expansion coefficient.

An impurity diffusion barrier film (not shown) may be disposed between the substrate 1 and the back contact 2.

As described above, the light absorption layer 3 includes the P type CIGS layer 31 and the N type CIGS layer 32, which are coupled to each other form a single junction.

The P type CIGS layer 31 is formed through a CuInGaSe$_2$ thin film forming process, and the N type CIGS layer 32 is formed by mixing an alkali metal and a selenide.

CuInGaSe$_2$ thin film forming methods include an evaporation method as a physical method, a sputtering/selenization method, and an electroplating method as a chemical method. Each method may employ various manufacturing methods according to the type of a starting material (such as a metal or a binary compound).

According to the current embodiment, four metal elements Cu, In, Ga, and Se are used as starting materials in a co-evaporation method. Unlike physical/chemical thin film manufacturing methods in the related art, nano-particles (such as powder and colloid) may be synthesized on a Mo substrate, and be mixed with solvent, and be processed using screen printing and reaction sintering to manufacture a light absorption layer.

Na as an alkali metal is mixed with Na$_2$Se as a selenide to deposit the N type CIGS layer 32 using the co-evaporation method. Although Na and Na$_2$Se are used in the current embodiment, a group IA element such as K, Rb, Cs, and Fr as alkali metals having similar characteristics, and NaF, Na$_2$S, or Na$_2$Se may be used in another embodiment of the present invention.

The reflection prevention film 4 is formed of MgF$_2$ using an electron-beam evaporation method as a physical thin film manufacturing method. The reflection prevention film 4 reduces a reflection loss of sunlight absorbed by the solar cell to increase the efficiency of the solar cell by approximately 1%.

A grid electrode 5 for collecting a current on a surface of the solar cell is formed of Al or Ni/Al.

Since the amount of absorbed sunlight is decreased by the area of the grid electrode 5, the efficiency of the solar cell may be decreased. Thus, the grid electrode 5 is disposed at a side of the reflection prevention film 4.

Referring to FIG. 2, a window layer 6 may be deposited on the N type CIGS layer 32 between the light absorption layer 3 and the reflection prevention film 4.

Since the window layer 6 functions as a transparent electrode on a front surface of the solar cell, the window layer 6 has high light transmissivity and high electrical conductivity.

A ZnO thin film used as a transparent electrode has an energy band gap of approximately 3.3 eV and a high light transmissivity of approximately 80% or greater. Furthermore, the ZnO thin film may be doped with Al or B to have a low resistance of approximately $10^{-4}$ Ωcm or less. When the ZnO thin film is doped with B, light transmissivity increases in a near infrared region to increase a short circuit current.

The ZnO thin film may be deposited using a radio frequency (RF) sputtering method with a ZnO target, or using a reactive sputtering method with a Zn target, or using a metal organic chemical vapor deposition method.

A double structure that an indium tin oxide (ITO) thin film having excellent electro-optical characteristics is deposited on a ZnO thin film may be used.

A solar cell according to an embodiment of the present invention will now be compared with a solar cell in the related art.

A light absorption layer of the solar cell in the related art includes only a CuInGaSe$_2$ thin film that is a P type semiconductor forms a PN junction with a ZnO thin film that is an N-type semiconductor and is used as a window layer.

However, since the CuInGaSe$_2$ thin film is quite different from the ZnO thin film in lattice constant and energy band, a buffer layer is necessary therebetween for a junction without a defect.

The buffer layer is formed of CdS. However, Cd is poisonous, and a wet chemical process is used for the buffer layer, unlike other thin films.

Thus, toxic materials are used for removing surface and interface contamination due to a hetero junction, and the solar cell may be degraded.

In the light absorption layer 3 of the solar cell according to the embodiment of the present invention, since the P type CIGS layer 31 is coupled to the N-type CIGS layer 32 to form a single junction, the quality of the thin film is improved, and thus, the performance of the solar cell is improved. In addition, since CdS constituting a buffer layer is not used, environmental pollutions can be prevented.

As described above, according to the embodiment of the present invention, the P type CIGS layer 31 is coupled to the N-type CIGS layer 32 to form the solar cell including the light absorption layer 3 in a single junction structure, and thus, surface and interface contamination due to a buffer layer and environmental pollutions due to a toxic element can be prevented, and the performance of the solar cell can be improved.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a single junction type (Cu (In, Ga) Se$_2$)(CIGS) thin film solar cell, the method comprising:
    preparing a substrate;
    depositing a back contact of molybdenum (Mo) on the substrate by using a sputtering method;
    depositing a P type CIGS layer on the back contact by using a co-evaporation method;
    depositing an N type CIGS layer on the P type CIGS layer; and
    depositing a reflection prevention film of MgF$_2$ on the N type CIGS layer by using an electron-beam evaporation method.

2. The method of claim 1, wherein the depositing of the N type CIGS layer comprises mixing an alkali metal with a selenide, and using a co-evaporation method.

3. The method of claim 2, wherein the alkali metal comprises natrium (Na).

4. The method of claim 3, wherein the selenide comprises Na$_2$Se.

5. The method of claim 1, wherein the P type CIGS layer touches the N type CIGS layer.

6. The method of claim 1, further comprising forming a window layer touching the N type CIGS layer.

7. The method of claim 6, wherein in forming the window layer, the window layer is formed so as to be between the N type CIGS layer and the reflection prevention film, and the window layer touches the reflection prevention film.

8. The method of claim 6, wherein the window layer is a transparent electrode.

9. The method of claim 8, wherein the window layer includes ZnO.

* * * * *